United States Patent [19]
Cowens et al.

[11] Patent Number: 6,087,192
[45] Date of Patent: Jul. 11, 2000

[54] POLYMER MARKER

[75] Inventors: Marvin W. Cowens, Plano, Tex.; Rodel M. Roderos, Baguio, Philippines

[73] Assignee: Texas Instruments Incorporated, Dallas, Tex.

[21] Appl. No.: 09/388,728

[22] Filed: Sep. 2, 1999

Related U.S. Application Data

[60] Provisional application No. 60/099,047, Sep. 3, 1998.
[51] Int. Cl.$^7$ .......................... H01L 21/66; G01R 31/26
[52] U.S. Cl. .......................... 438/14; 438/15; 156/626.1
[58] Field of Search ................................. 438/14, 15, 16, 438/18, 111, 123; 156/626.1; 33/34; 53/65; 116/211; 257/47

[56] References Cited

U.S. PATENT DOCUMENTS

| | | | |
|---|---|---|---|
| 4,437,229 | 3/1984 | Bitler et al. | 29/593 |
| 5,585,281 | 12/1996 | Truhitte et al. | 437/8 |

OTHER PUBLICATIONS

Defective Semiconductor Chip Marker Fixture for a Deck Testing Tool. IBM Technical Disclosure Bulletin, vol. 31, No. 3. Aug., 1988. pp. 78–79.

*Primary Examiner*—Donald L. Monin, Jr.
*Assistant Examiner*—Ginette Peralta
*Attorney, Agent, or Firm*—Mark A. Valetti; Carlton H. Hoel; Frederick J. Telecky, Jr.

[57] ABSTRACT

An embodiment of the instant invention is a method of making a semiconductor device situated within a package with conductive leads extending from the package, the method comprising the steps of: testing a plurality of the semiconductor devices so as to determine defective devices; and marking the defective devices with a polymer marker able to withstand temperatures in excess of 200 C., acids with a pH of less than 2, and basic solutions with a pH of greater than 11. Preferably, the polymer marker is comprised of a surfactant, a solvent, a polymer backbone, and a dye, and may additionally include an adhesion promoter. The surfactant is, preferably, comprised of: SVC-15, isopropanol, and any combination thereof. The solvent is, preferably, comprised of a substance consisting of: ENSOLV, bromopropane, chloropropane, and $C_nH_{2n+1}X$ (where X is a halogen and n is between 3 and 5), and any combination thereof. Preferably, the polymer backbone is comprised of: PMMA and an acrylate with a molecular weight between 30 and 100,000 AMU/gram.

14 Claims, No Drawings

POLYMER MARKER

This application claims priority under 35 USC §119(e)(1) of provisional application No. 60/099,047 filed Sep. 3, 1998.

FIELD OF THE INVENTION

The instant invention pertains to a polymer marker which will withstand high temperatures, acidic and basic solutions.

BACKGROUND OF THE INVENTION

In semiconductor device processing, identification of defective devices is crucial. This is especially true directly before shipping devices to customers. Presently, most manufacturers mark defective devices which are already packaged by scribing, with a diamond tipped scribe, a symbol (such as an "X") on the packaging. Scribing is commonly practiced because this mark will not be removed by processing subsequent to the actual marking of the package. Examples of subsequent processing include a post packaging anneal which can be in excess of 300 C.; plating processing to plate the lead frames with a conductor (such as a metal); and package and lead frame clean up in acidic (pH around 1 to 3) and/or basic (pH around 11 to 14—probably closer to 12–13).

While the scribing of the plastic encapsulation to designate a bad device will survive these process steps, it is also very difficult to see. This is problematic because are large number of these packaged devices are processed simultaneously and it is difficult for an operator to readily sift through all of these devices are pull out all of the defective devices which are marked with the scribe d "X".

More specifically, all of these packaged devices are processed together because they are tied together by the metal structure which forms each device's lead frames (the metallic pins which extend from the packaged device). Hence, when a device is determined to be defective it is not immediately discarded because it would not be cost-effective to cut away the defective devices from the common metallic structure which forms the lead frames to each packaged device. Instead, the defective devices are scribed so that after the packaged devices are separated from one another, a sorting process can be performed whereby the defective devices (indicated by the scribed mark) can be discarded. Due to the large number of packaged devices that must be sorted at any given time and the difficulty of discerning a scribed device from an unscribed device, this process is very time consuming, expensive and inefficient because several devices slip through this process and end up in the end users product.

Hence, there is a need for a method of marking these defective packaged devices which is readily discernable to a human eye or other detecting device.

SUMMARY OF THE INVENTION

An embodiment of the instant invention is a method of making a semiconductor device situated within a package with conductive leads extending from the package, the method comprising the steps of: testing a plurality of the semiconductor devices so as to determine defective devices; and marking the defective devices with a polymer marker able to withstand temperatures in excess of 200 C., acids with a pH of less than 2, and basic solutions with a pH of greater than 11. Preferably, the polymer marker is comprised of a surfactant, a solvent, a polymer backbone, and a dye, and may additionally include an adhesion promoter. The surfactant is, preferably, comprised of: SVC-15, isopropanol, and any combination thereof. The solvent is, preferably, comprised of a substance consisting of: ENSOLV, bromopropane, chloropropane, and $C_nH_{2n+1}X$ (where X is a halogen and n is between 3 and 5), and any combination thereof. Preferably, the polymer backbone is comprised of: PMMA and an acrylate with a molecular weight between 30 and 100,000 AMU/gram.

In one alternative embodiment, the step of marking the defective devices is marking the package with the polymer marker. If this is the case, the dye is, preferably, comprised of $TiO_2$ or zinc oxide.

In another alternative embodiment, the step of marking the defective devices is marking the conductive leads with the polymer marker. If the conductive lead is comprised of Pd, then the dye is, preferably, comprised of a copier phthalocyanine derivative. If the conductive lead is comprised of Cu, then the dye is, preferably, comprised of cobalt aluminate blue spinel.

DETAILED DESCRIPTION OF THE INVENTION

While the following description revolves around the marking of packaged semiconductor devices which are defective, the polymer of the instant invention can be used to mark nearly anything. Advantages of the polymer of the instant invention (on a semiconductor packaging material—preferably phenolic/Novalek Resin) include: it can withstand temperatures in excess of around 300 C.; it can withstand acidic solutions which have a pH value of around 1 or less; it can withstand basic solutions which have a pH value of around 12 to 13 or more; it dries within 30 to 40 seconds (preferably closer to around 15 to 30 or 20 to 30 seconds); it can withstand a high pressure (preferably the pressure is around 10 to 30 psi) water rinse; and it is highly visible on a dark background.

The marking polymer of this embodiment of the instant invention preferably exhibits all of the aforementioned advantages along with being substantially non-caustic to humans and easily applied by humans or machines to the surface of the substance to be marked (e.g. the semiconductor package—preferably a phenolic/Novalak resin or other plastic-type encapsulation). Hence, the polymer should include a surfactant so that it is easily applicable (preferably through a pen-type device). In one preferred embodiment, the surfactant is comprised of 15 grams of SVC-15 which is about 10% by weight of the total composition of the polymer. Isopropanol can be utilized as the surfactant, also.

The marking polymer of the instant invention also should have a polymer backbone. In this preferred embodiment, the polymer backbone is provided by 13 grams of PMMA [poly(methyl methacrylate)] which is around 9% by weight of the total composition. Any acrylate with a molecular weight of between 30 and 100,000 AMU/gram can be utilized to form the polymer backbone.

In order to enhance the drying of the polymer marker of the instant invention a solvent is preferably included within the marker polymer. In this preferred embodiment, the solvent is comprised of 87 grams of Ensolv (which is around 59% by weight of the total solution). However, other solvents can be used. Bromopropane; 1, chloropropane; or $C_nH_{2+1}X$ (where X is any halogen and n can be any number but is preferably between 3 and 5) can be used in place of or in conjunction with Ensolv.

In order to properly mark semiconductor packaging an adhesion promoter is preferably so that the polymer marker will not simply flake off of the packaging. However, in other uses the adhesion promoter may or may not be necessary. In fact, a different adhesion promoter may be beneficial. In this preferred embodiment, the adhesion promoter is preferably comprised of around two grams of Plasthall Tacifier (which is around 1 to 2% by weight of the total solution). In an alternative embodiment, the tacifier may be comprised of one or more of the-following: rosins, polyester adipates, adipate monomeric plasticizers, and/or adipate polymeric plasticizers.

In addition, the marking polymer should also be comprised of a dye-like material which is fairly easily discernable on the background in which this marker is to be applied. In this preferred embodiment, the dye-like material is comprised of around 31 to 32 grams of finely ground (so that the marking polymer is easily applied with a pen-like device) $TiO_2$, which is around 21 to 22% by weight of the total solution. Zinc oxide may be used in conjunction with the titanium oxide or in place of it.

In an alternative embodiment, a polymer-based marker can be used to mark the metal leads of the devices. Just like the polymer-based marker of the previous embodiment, this marker preferably includes one or more of the following: a solvent, a surfactant, a polymer backbone, a tacifier, and dye. The same materials for the marker of the previous embodiment may be used in this embodiment, but a different color dye is preferably so that it can be discernable against the metal background.

If the leadframe is comprised of Pd, the dye is preferably comprised of a copper phthalocyanine derivative (or any other phthalocyanine derivative). However, if the leadframe is comprised of copper, the dye is preferably comprised of cobalt aluminate blue spinel (or any other cobalt compound). The dye is preferably on the order of 1 to 30 percent by weight of the total composition (preferably on the order of 1 to 5 percent by weight for the Pd leadframe marker and around 23 to 28 percent by weight for the Cu leadframe marker).

For both types of leadframe markers the following materials are preferably used: 40 to 70 percent by weight of bromopropane or its equivalent for the solvent (more preferably around 50 to 67 percent by weight); 8 to 16 percent by weight of SVC-15 or its equivalent for the surfactant (more preferably around 10 to 14 percent by weight); around 10 to 20 percent by weight of poly(methyl methacrylate) or its equivalent for the polymer backbone (more preferably around 12 to 17 percent by weight); and 1 to 5 percent by weight of poly(diethylene) adipate or its equivalent for the tacifier (more preferably around 2 to 4 percent by weight).

The polymer-based marker of this embodiment can be utilized with any type of conductor used for the leadframe for semiconductor devices. This marker is used to mark defective devices by placing a mark on the leadframe. In addition, this marker can be used to mark non-defective devices with tracking information or any other information.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of making a semiconductor device situated within a package with conductive leads extending from the package, said method comprising the steps of:

testing a plurality of said semiconductor devices so as to determine defective devices; and marking said defective devices with a polymer marker able to withstand temperatures in excess of 200 C., acids with a pH of less than 2, and basic solutions with a pH of greater than 11.

2. The method of claim 1, wherein said polymer marker is comprised of a surfactant, a solvent, a polymer backbone, and a dye.

3. The method of claim 2, wherein said polymer marker additionally comprises an adhesion promoter.

4. The method of claim 2, wherein said surfactant is comprised of a substance selected from the group consisting of: SVC-15, isopropanol, and any combination thereof.

5. The method of claim 2, wherein said solvent is comprised of a substance consisting of: ENSOLV, bromopropane, chloropropane, or $C_nH_{2n+1}X$ (where X is a halogen and n is between 3 and 5), and any combination thereof.

6. The method of claim 2, wherein said polymer backbone is comprised of a substance selected from the group consisting of: PMMA and an acrylate with a molecular weight between 30 and 100,000 AMU/gram.

7. The method of claim 1, wherein said step of marking said defective devices is marking said package with said polymer marker.

8. The method of claim 7, wherein said dye is comprised of $TiO_2$.

9. The method of claim 7, wherein said dye is comprised of zinc oxide.

10. The method of claim 1, wherein said step of marking said defective devices is marking said conductive leads with said polymer marker.

11. The method of claim 10, wherein said conductive lead is comprised of Pd.

12. The method of claim 11, wherein said dye is comprised of a copper phthalocyanine derivative.

13. The method of claim 10, wherein said conductive lead is comprised of Cu.

14. The method of claim 13, wherein said dye is comprised of cobalt aluminate blue spinel.

* * * * *